US008056040B2

(12) United States Patent
Pucci et al.

(10) Patent No.: US 8,056,040 B2
(45) Date of Patent: Nov. 8, 2011

(54) METHOD AND SYSTEM FOR VISUAL IMPLEMENTATION OF LAYOUT STRUCTURES FOR AN INTEGRATED CIRCUIT

(75) Inventors: Steven Lee Pucci, Los Gatos, CA (US); Richard Brashears, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 510 days.

(21) Appl. No.: 11/965,676

(22) Filed: Dec. 27, 2007

(65) Prior Publication Data
US 2009/0172626 A1   Jul. 2, 2009

(51) Int. Cl.
*G06F 17/50* (2006.01)
(52) U.S. Cl. .................... 716/119; 716/111; 716/139
(58) Field of Classification Search ............. 716/1, 8–11, 716/16, 17, 102, 116, 117, 118–123, 111, 716/139
See application file for complete search history.

(56) References Cited

U.S. PATENT DOCUMENTS

| 5,513,119 A | 4/1996 | Moore et al. |
|---|---|---|
| 5,553,002 A | 9/1996 | Dangelo et al. |
| 6,721,922 B1 | 4/2004 | Walters et al. |
| 6,966,039 B1 * | 11/2005 | Bartz et al. .................... 716/1 |
| 7,406,674 B1 * | 7/2008 | Ogami et al. .................. 716/17 |

OTHER PUBLICATIONS

Darring, J. et al, "EDA in IBM: Past, Present, and Future", IEEE Transactions on Computer Aided Design of Integrated Circuits and Systems, vol. 19, No. 12, pp. 1476-1497, Dec. 2000.
OST, LC et al, "Jale3D-platform-independent IC/MEMS layout edition tool", 14th Symposium on Integrated Circuits and Systems Design, Sep. 2001, pp. 174-179.
Khare, A. et al, "V-SAT: A Visual Specification and Analysis Tool for System-On-Chip Exploration", 25 th EUROMICRO Conference, Sep. 1999, v. 1, pp. 196-300.
Horng, C. et al, "An Automatic/Interactive Layout Planning System for Arbitrarily-Sized Rectangular Building Blocks", 18th Design Automation Conference, Jun. 1981, paper 14.4, pp. 293-300.
Gehring, et al, "An Integrated Framework for Structured Circuit Design with Field-Programmable Gate Arrays", A Dissertation submitted to t he Swiss Federal Institure of Technology Zurich, Diss. ETH No. 12188, 1997.

* cited by examiner

*Primary Examiner* — Vuthe Siek
(74) *Attorney, Agent, or Firm* — Vista IP Law Group, LLP

(57) ABSTRACT

The present approach is directed to an improved method, system, and computer program product for visually presenting layout options for generating an electronic design. The visual presentation could be employed to display a set of layout choices when correcting errors or rules violations identified in the design. Alternatively, the visual presentation could be employed to display layout choices during the initial design entry phase for the electronic design.

27 Claims, 13 Drawing Sheets

METHOD AND SYSTEM FOR VISUAL IMPLEMENTATION OF LAYOUT STRUCTURES FOR AN INTEGRATED CIRCUIT

BACKGROUND

An integrated circuit (IC) has a large number of electronic components, such as transistors, logic gates, diodes, and wires, that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical design of the IC from the logical design. The layout EDA application uses geometric shapes of different materials to create the various electrical components on an integrated circuit and to represent electronic and circuit IC components as geometric objects with varying shapes and sizes. The geometric information about the placement of the nodes and components onto the chip may be determined by a placement process and a routing process. The placement process is a process for placing electronic components or circuit blocks on the chip and the routing process is the process for creating interconnections between the blocks and components according to the specified netlist.

After an integrated circuit designer has created an initial integrated circuit layout, the designer then verifies and optimizes the integrated circuit layout using a set of EDA testing and analysis tools. Verification may include, for example, design rule checking to verify compliance with rules established for various IC parameters.

With modem EDA design tools, both the initial process of generating a layout and the later process of correcting problems within a layout are usually performed with automated approaches. The automated approaches will result in the placement of geometric features within the layout without requiring manual intervention by a user regarding selection of the specific combination of patterns that is to be used on the layout.

The problem with these automated approaches is that there may be many different combinations of legal placement options for the layout, and the particular placement option selected by the system may not be the exact option that the user would have selected if given the choice. In fact, the user may not have even been informed that there are alternate options that could have been legally used by the system.

SUMMARY

Embodiments of the present invention are directed to an improved method, system, and computer program product for visually presenting layout options for generating an electronic design. The visual presentation could be employed to display a set of layout choices when correcting errors or rules violations identified in the design. Alternatively, the visual presentation could be employed to display layout choices during the initial design entry phase for the electronic design.

Other and additional objects, features, and advantages of the invention are described in the detailed description, figures, and claims.

DETAILED DESCRIPTION

The present invention is directed to an improved method, system, and computer program product for visually presenting layout options for generating an electronic design.

For any given portion of an electronic layout, there may be any number of alternate possible ways to implement the geometric features in that layout portion. Some of those possible layout configurations may be more desirable or suitable for a given purpose than other possible layout configurations.

With conventional EDA tools, selection criteria would be employed to automatically select one of the many alternate layout configurations to be used in the design. However, since the EDA tool manufacturer is providing products to many different kinds of circuit designers across many industries, the selection criteria in the conventional EDA tool would be configured to make the selection based upon "lowest common denominator" criteria to provide relatively good performance for a general broad-based target audience of designers.

While the selection criteria for automated systems may generally provide good performance, the automated selection criteria is not likely to be optimized to make the best selection for the needs of any particular designer in a given industry for a given type of design. As a result, it is quite likely that the layout configuration automatically selected by the EDA tool does not correspond to the layout configuration that a designer would have selected if given the choice. In some cases, the automatically selected layout configuration could be significantly sub-optimal for the particular design or product environment to which it is being used. Even within the same design, it may be desirable to employ different design criteria for the different portions of that design.

According to embodiments of the present invention, this problem is addressed by providing an interface for visually presenting different layout configuration options to a designer. The interface also provides a mechanism for selecting one of the layout configurations options to be implemented in the design.

Figure 1:
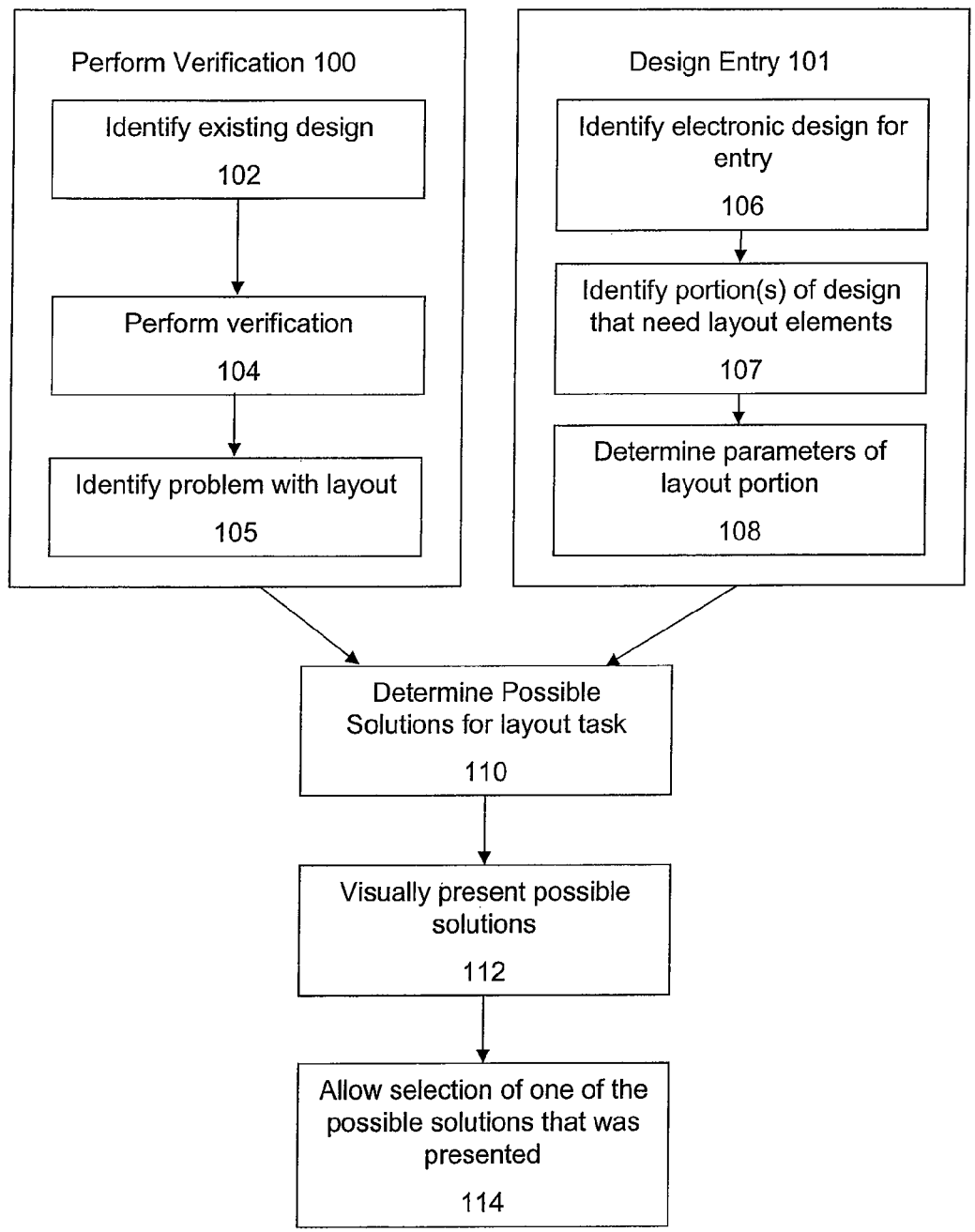
FIG. 1 shows a flowchart of a process for implementing a visual interface according to some embodiments of the inventions.

FIG. 1 shows a flowchart of a process for implementing a visual interface according to some embodiments of the inventions. There are many modes of operation to which the invention may be applied. A first example mode of operation pertains to the verification context in which an existing circuit design is being analyzed to identify and correct design problems (100). A second example mode of operation is in the design entry context, in which a user is entering and implementing an original layout for an electronic design (101).

For the first mode of operation in which verification is being performed (100), an existing design is first identified for verification (102). Next, verification is performed upon the electronic design (104). Any suitable approach can be taken to verify the circuit design. For example, DRC (design rule check) operations may be performed to verify the design. Model-based analysis may also be performed to verify the design. Based upon the verification operations, one or more layout configuration problems may be identified within the electronic design (105). The task of identifying layout solutions to solve these layout configuration problems is the subject of the visualization techniques for the present invention.

For the second mode of operation in which design entry is being performed (101), identification is first made of the design that needs to be entered (106). Next, one or more portions of the design are identified as requiring the verification is performed upon the electronic design (104). This would include any routes or nets that need to be configured to include the geometric shapes corresponding to wires and other structures to form the routes or nets. Routing and circuit parameters for the identified portions that require routing are identified and considered (108). For example, if a routing path needs to be established between two pins, then this action would identify the pins, the pin locations, and other environmental/existing layout information that would be relevant to planning of the layout structures for the routing path. For the design entry operating mode, the task of forming the layout for these routing paths is the subject of the visualization techniques for the present invention.

For either operating mode, the next action is to determine a set of possible solutions for the layout configuration task (110). The present embodiment contemplates that there will likely be multiple solutions that can be identified for a given layout task. For example, for a given net that needs to be routed within a circuit design, there are likely to be multiple possible paths through the layout that can be made to configure that net. Any suitable layout or routing algorithm may be employed to determine the set of possible solutions to the identified layout task, with the caveat that the layout or routing algorithm(s) are to be employed to generate multiple possible solutions.

An interface is provided to the user to visually present possible solutions to the layout task (112). According to some embodiments, the interface comprises a menu or list structure that includes a listing of the possible solutions to the layout task. Hovering or holding a mouse pointer over an item in the menu allows the layout view of the design to be modified to include a visual representation of that solution as applied to the layout. Hovering or holding the pointer over another possible solution causes the layout view to shift to a visual representation of the other solution as applied to the layout. Clicking or selecting the menu item with the pointer causes the present solution to be selected for entry within the design.

In this manner, the user can scroll through the list or menu of possible solutions, with layout visualizations for each solution displayed to the user as desired, until a suitably attractive solution for the layout configuration has been identified. At this point, the user can select the desired solution to enter that layout configuration into the design record (114). This action is performed by selecting (or clicking) the menu item that corresponds to the desired solution.

Figure 2A:
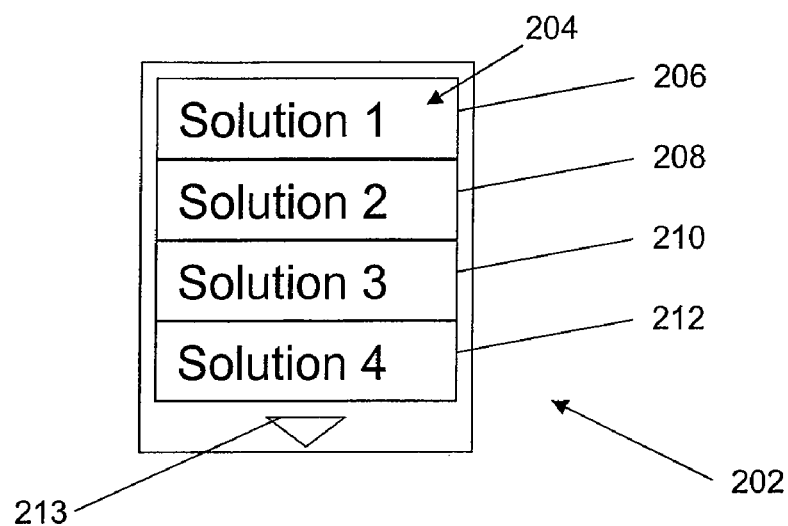
FIGS. 2A-C illustrate example menu structures that can be employed to display to the user possible solutions to a layout task.
Figure 2B:
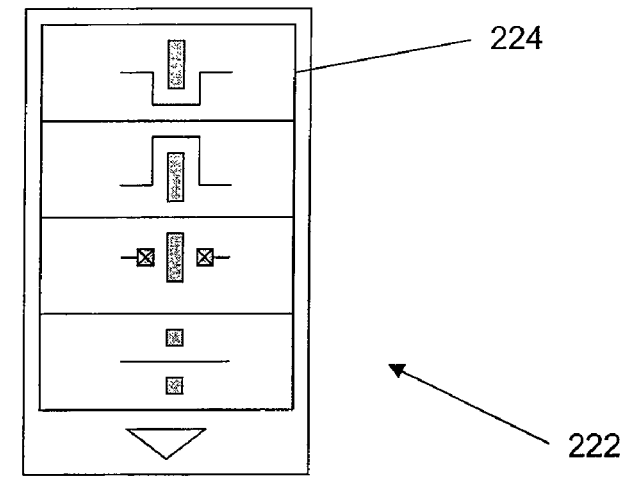
Figure 2C:
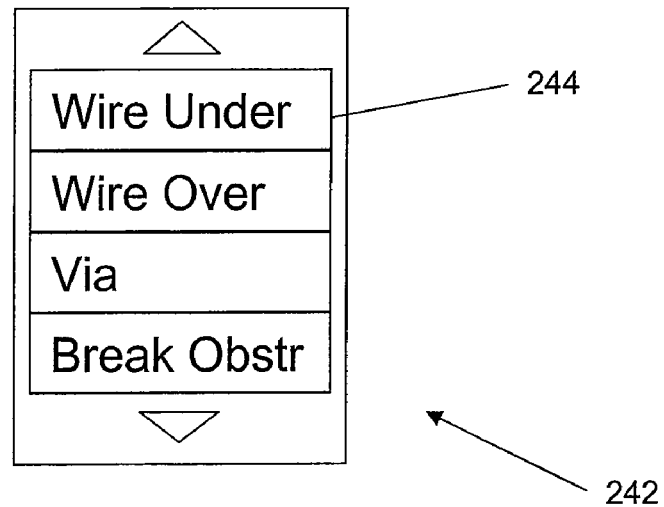

FIGS. 2A-C illustrate some example menu structures that can be employed to display to the user the possible solutions to the layout task. Each of these example menu structures may be implemented as a mouse (or any other type of pointer) initiated menu that is scrollable and clickable. If there are more possible solutions than space to list those solutions, then the menu structure would only list a few of those solutions, but would be scrollable to allow the other solutions to be listed based upon user control. If there are additional items to list that cannot fit within the available space within the menu structure, then scrolling control structures, such as arrow 213, can be used to navigate through the items within the menu structure.

FIG. 2A shows a first example of a menu structure 202 that can be employed within embodiments of the invention. In this example structure, each possible solution corresponds to a separate item within the menu. Four solutions are listed in menu structure 202, including menu items 206, 208, 210, and 212. Each solution in this example is identified by only a solution identifier. For example, the solution identified as menu item 206 is displayed with the text tag "Solution 1." The problem with this approach is that there is very little useful information with this type of text tag, since it merely lists a solution number or non-specific identifier. However, these text tags are easy to generate and do not require the system to interpret or have knowledge of properties of the individual solutions, as may be required for other menu structures as described below.

FIG. 2B shows an alternate approach for implementing a menu structure 222. In this menu structure 222, the layout configuration for each possible solution is visually represented within the menu structure itself. In essence, a pictorial representation of the possible layout solution is generated, e.g., as a bitmap, and inserted within the label portion of the menu items in the menu structure. For example, in the menu structure 222, menu item 224 is shown with a pictorial depiction of a wire running under and around an obstruction. Therefore, the layout configuration corresponding to this possible solution likely includes wiring objects that extend below and around an obstruction within the layout. The pictorial depiction may be configured to show the illustrated layout structure with accurate relative proportions for the illustrated features. Alternatively, the pictorial depiction may be configured to show a pictogram that generally illustrates an approximate thumbnail picture of the layout solution, without promising accurate proportions to any illustrated feature relative to other illustrated features.

FIG. 2C shows another possible approach for implementing a menu structure 242. In this menu structure 242, the layout configuration for each possible solution is textually represented within the menu structure with a text description of the possible solution. For example, in the menu structure 242, menu item 244 is shown with a text description "Wire Under" to indicate that it is likely to involve a wiring structure that is placed under and around another structure, similar to the solution indicated by menu item 224 in FIG. 2B.

It is desirable to order the list of possible solutions that is presented to the user within the menu structure. Generally, it would be preferable to list the most optimal solutions higher on the menu list than the less optimal solutions. This approach should allow the user to more rapidly identify the desirable solutions from the menu structure.

Figure 3:
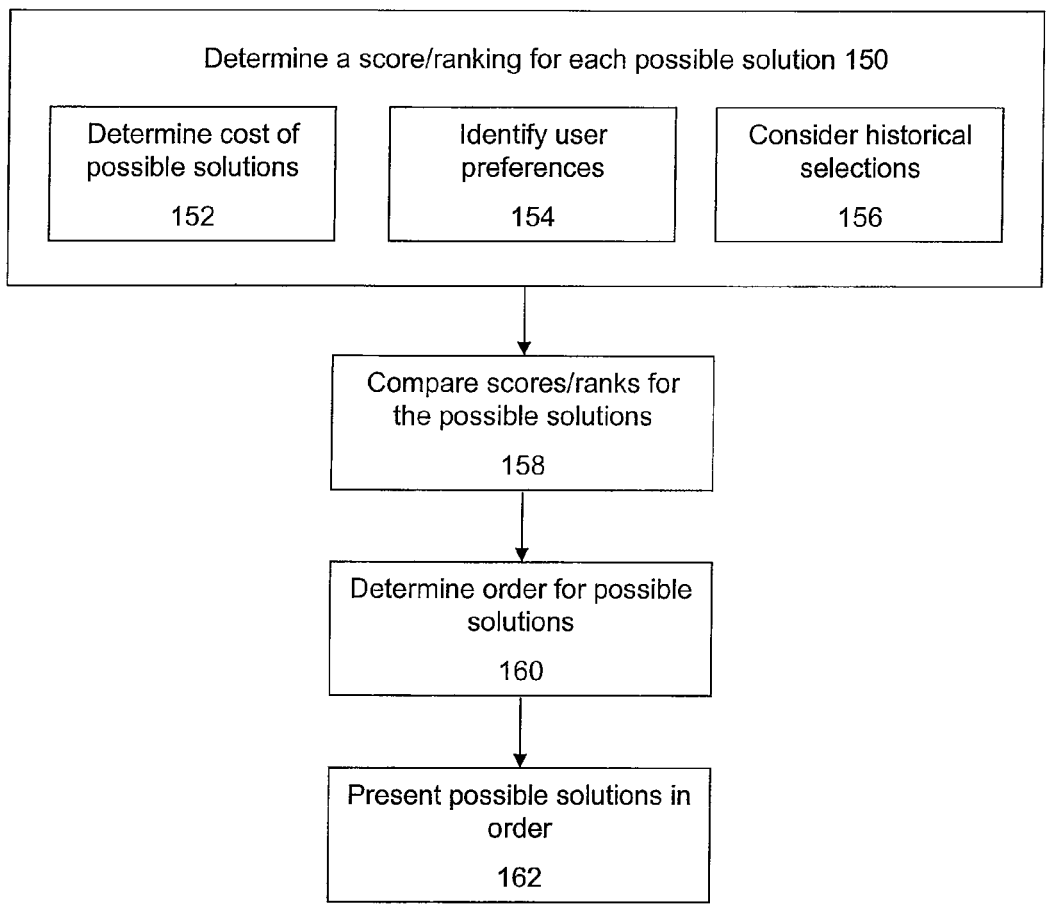
FIG. 3 shows an approach for ordering a list of displayed menu items according to an embodiment of the invention.

FIG. 3 shows one approach for ordering the list of displayed menu items according to an embodiment of the invention. The approach determines a score or ranking for each possible solution (150), with the score/ranking either being an absolute score value or a relative score/ranking that is with respect to the score/ranking of the other solutions.

There are numerous ways that can be taken to generate scorings or rankings for the possible layout solutions. One possible approach is-to use a priority cost function to score or rank the solutions, with a cheaper solution displayed prior to a more expensive solution (152). Any number of factors may be considered to determine the cost of a layout solution. For example, the cost function may consider the amount of layout area that is used for a layout configuration, the number of edges for the layout objects in a given configuration, the amount of rule violation costs, and/or manufacturability based upon model analysis.

User preferences may be considered when ranking or scoring the different layout options (154). For example, the user may have established certain preferences relating to the usage or manipulation of vias, as opposed to usage or manipulation of wires in the design. These user preferences can be used as weighting factors or filters when determining the score or rank of a layout solution.

Historical actions or past selections by users can also be considered when ranking or scoring the different layout options (156). For example, the user may have previously established a pattern of usage that shows a preference to manipulate wires rather than vias in the design. These historical usage or selection patterns can be used to help rank the solutions involving wire manipulations to be listed higher than comparable via manipulation solutions. These historical factors can be used as weighting factors or filters when determining the score or rank of a layout solution.

Once the scores and/or ranks of the different layout options have been established, those scores or ranks are compared against each other (158). An ordering is thereby identified for the different layout options (160). The menu structure would then be used to present the possible layout solutions to the user in the established order (162).

Figure 4A:
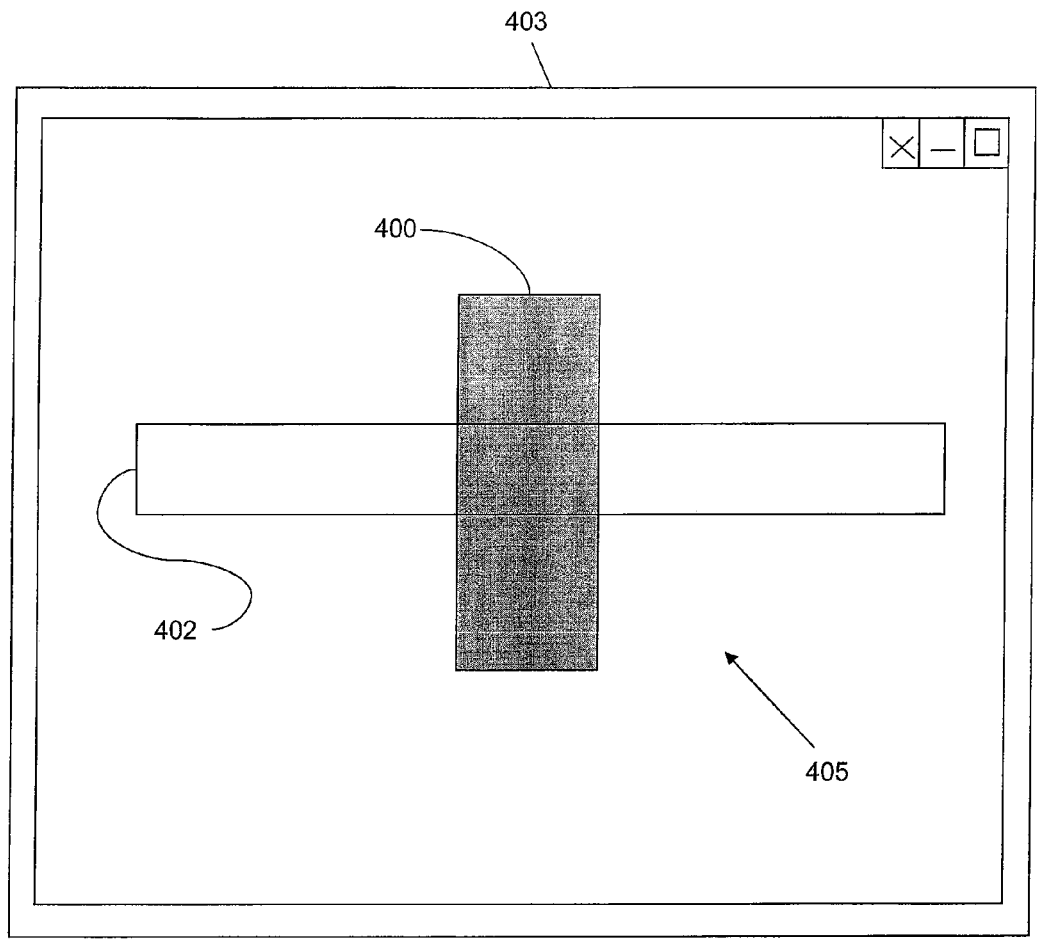
FIGS. 4A-E illustrate embodiments of the invention applied to visually display layout options.

To illustrate application of one embodiment of the invention, consider the layout configuration 405 shown in FIG. 4A. This figure shows an interface 403 that provides a view of layout configuration 405 having layout objects 400 and 402. Assume that object 402 is a wiring object that needs to establish a routing path from a pin on the left side of object 400 to the right side of object 400.

In this example layout, there is a serious design error since wiring object 402 intersects with an obstruction, i.e., object 400. This is a problem that needs to be addressed prior to finalization and tape-out of the electronic design. During verification, it is highly likely that this problem will be recognized by a verification or checker tool. It is also likely that there are numerous possible solutions to this design error.

Figure 4B:
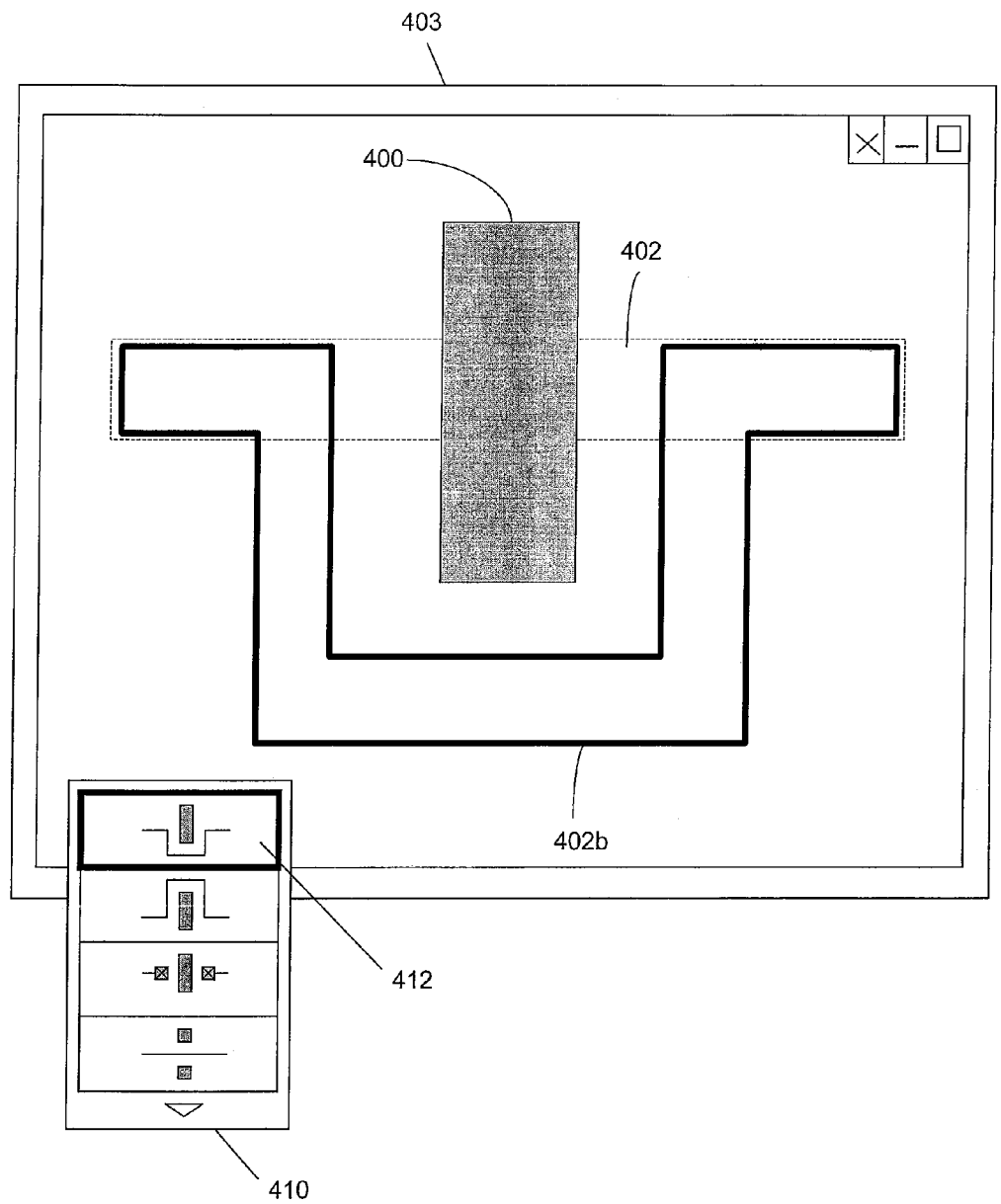

FIG. 4B illustrates an embodiment of the invention that provides a visual presentation of a possible solution to this design problem. In this illustrated example, it is assumed that a set of possible layout solutions has been identified and ordered for the design problem. A menu structure 410 is displayed to the user to visually list the possible solutions. The user may choose to visualize one of the items on the menu structure 410 for visual display within the layout view of window 403. In the present example, the user has chosen menu item 412 for visual presentation of the possible layout solution, e.g., by hovering or "mousing" over the menu item 412 with a mouse pointer. With this visualization of item 412, window 403 is configured to visually display the representation of this possible solution within the layout. In this case, the displayed version of the layout is modified to include layout objects corresponding to routing path 402b, which routes below and around obstruction object 400. The original wiring object 402 can be displayed in a ghosted manner to provide a visual comparison with the original layout configuration. If the user finds this layout solution to be acceptable, then the user can select this layout solution to be entered as the configuration for this layout portion.

Figure 4C:
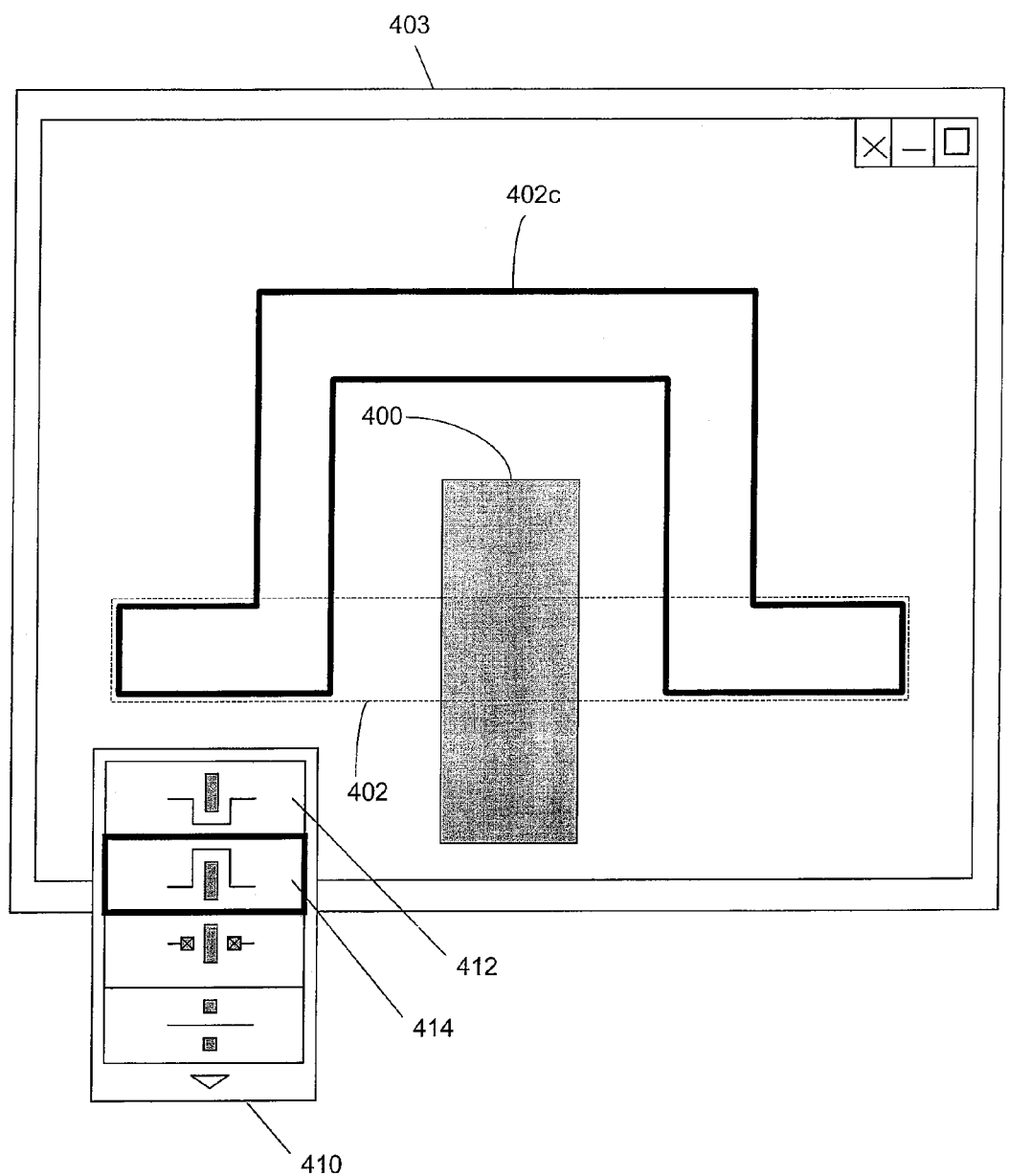

If it is desired to view additional layout options, then the user can scroll to another layout option from the layout menu 410. Turning to FIG. 4C, another illustrated example is shown in which the second item 414 from the menu structure 410 corresponds to another possible layout solution to the design problem. Solution 414 differs from solution 412 in that the revised routing path for solution 414 goes above the object 400 instead of beneath object 400. This can be visually recognized by the user in this example because the icon for solution 414 in menu structure 410 shows a pictorial representation of a wire that extends above and around an obstruction. By hovering the mouse pointer over item 414 from menu structure 410, window 403 is configured to visually display the representation of this possible solution within the layout. In this case, the displayed version of the layout is modified to include layout objects corresponding to routing path 402c, which routes above and around obstruction object 400. The original wiring object 402 can be displayed in a ghosted manner to provide a visual comparison with the original layout configuration. If the user finds this layout solution to be acceptable, then the user can select this layout solution to be entered as the configuration for this layout portion.

Figure 4D:
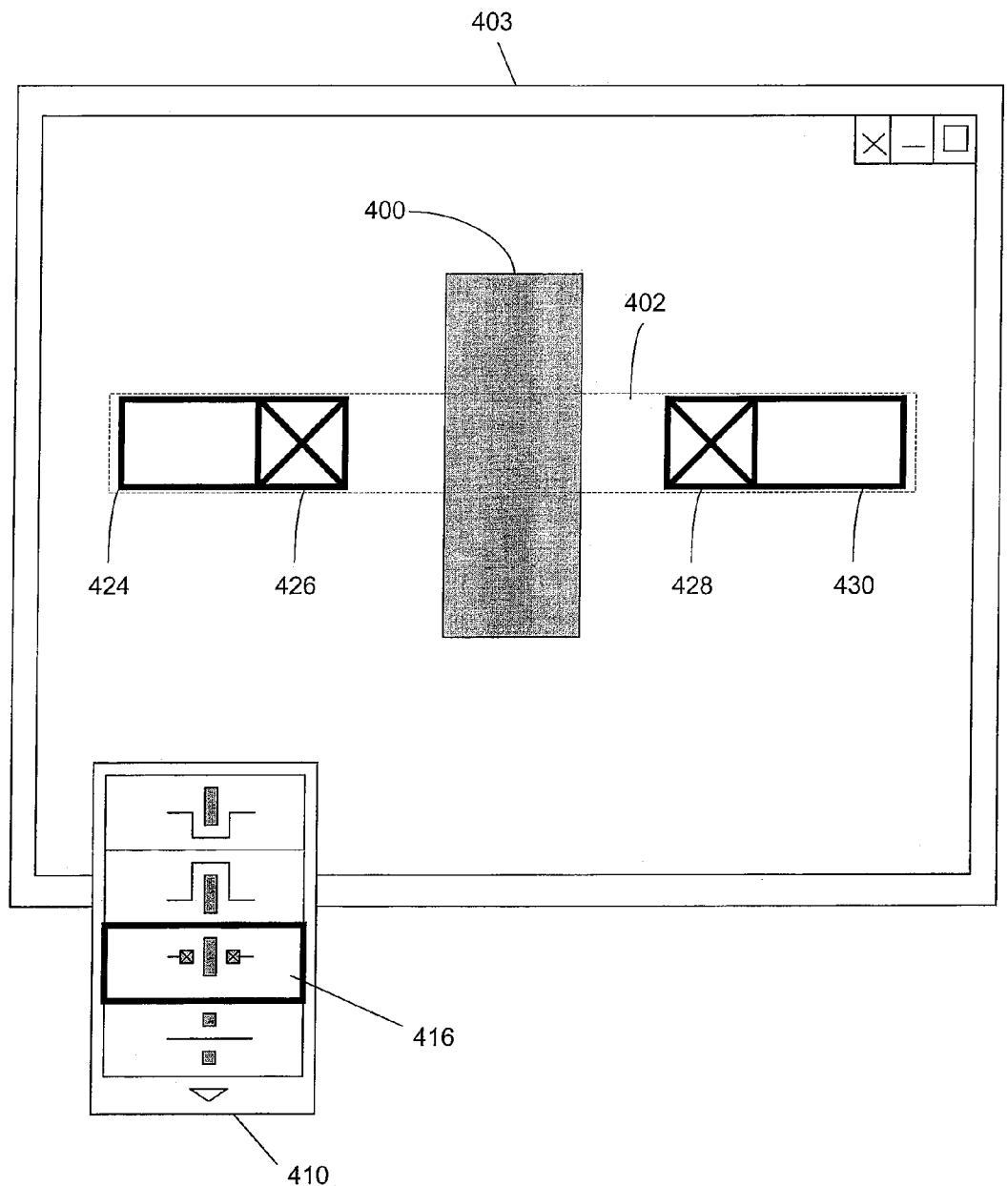

The possible solutions may involve the use of other types of layout structures. For example, FIG. 4D shows an illustrated example in which via objects are employed with the wire objects to provide a possible layout solution to the design problem. This solution corresponds to menu item 416 from menu 410, in which the routing path is configured to vias to route on another layer from the left side of object 400 to the right side of object 400. As before, this solution can be visually recognized by the user because the icon for solution 416 in menu structure 410 shows a pictorial representation of this solution. By hovering the mouse pointer over item 416 from menu structure 410, window 403 is configured to visually display the representation of this possible solution within the layout. In this case, the displayed version of the layout is modified to include layout objects corresponding to a wire object 424 to via object 426 and a via object 428 to wire object 430. As before, the original wiring object 402 can be displayed in a ghosted manner to provide a visual comparison with the original layout configuration. If the user finds this layout solution to be acceptable, then the user can select this layout solution to be entered as the configuration for this layout portion.

Figure 4E:
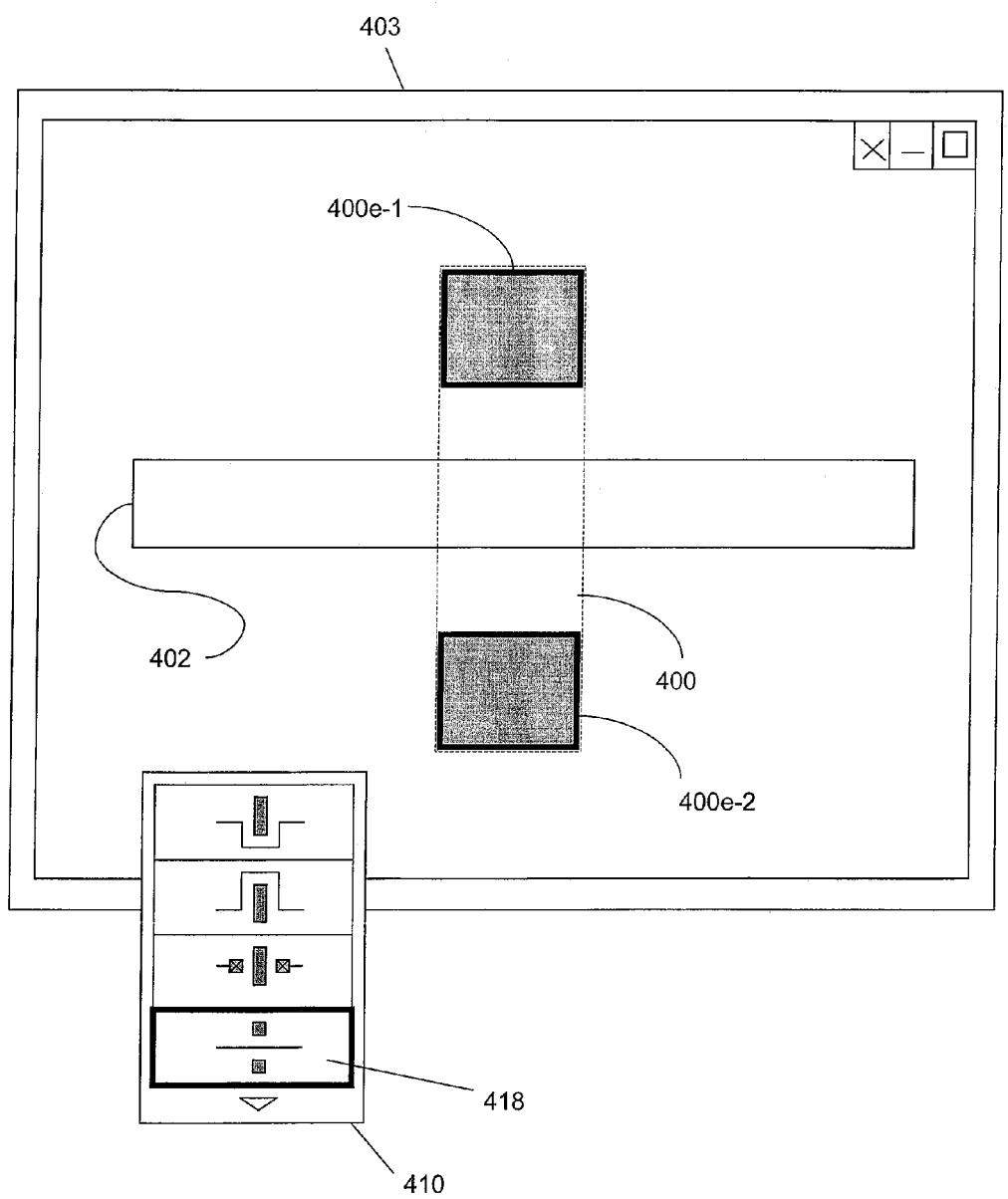

The possible solutions may involve manipulation of the obstruction object. FIG. 4E shows an illustrated example of this approach in which the obstruction object 400 is manipulated to provide a path for wiring object 402. This solution corresponds to menu item 418 from menu 410. As with the other solutions, this solution can be visually recognized by the user because the icon for solution 418 in menu structure 410 shows a pictorial representation of the manipulation of the obstruction object 400. When the mouse pointer is hovered over item 416 in menu structure 410, window 403 is configured to visually display the representation of this possible solution within the layout. In this case, the displayed version of the layout is modified to show object 400 modified to become objects 400e-1 and 400e-2. The original object 400 can be displayed in a ghosted manner to provide a visual comparison with the original layout configuration. If the user finds this layout solution to be acceptable, then the user can select this layout solution to be entered as the configuration for this layout portion.

One significant advantage provided by embodiments of the invention is that many different edge changes can be implemented in a fast and efficient process, while requiring only a minimal number of manual actions or "clicks" by the user. This occurs because a layout change involving many edges can be encapsulated by a single layout option that is selected and implemented based upon selection of an item from the visual menu structure.

Figure 5A:
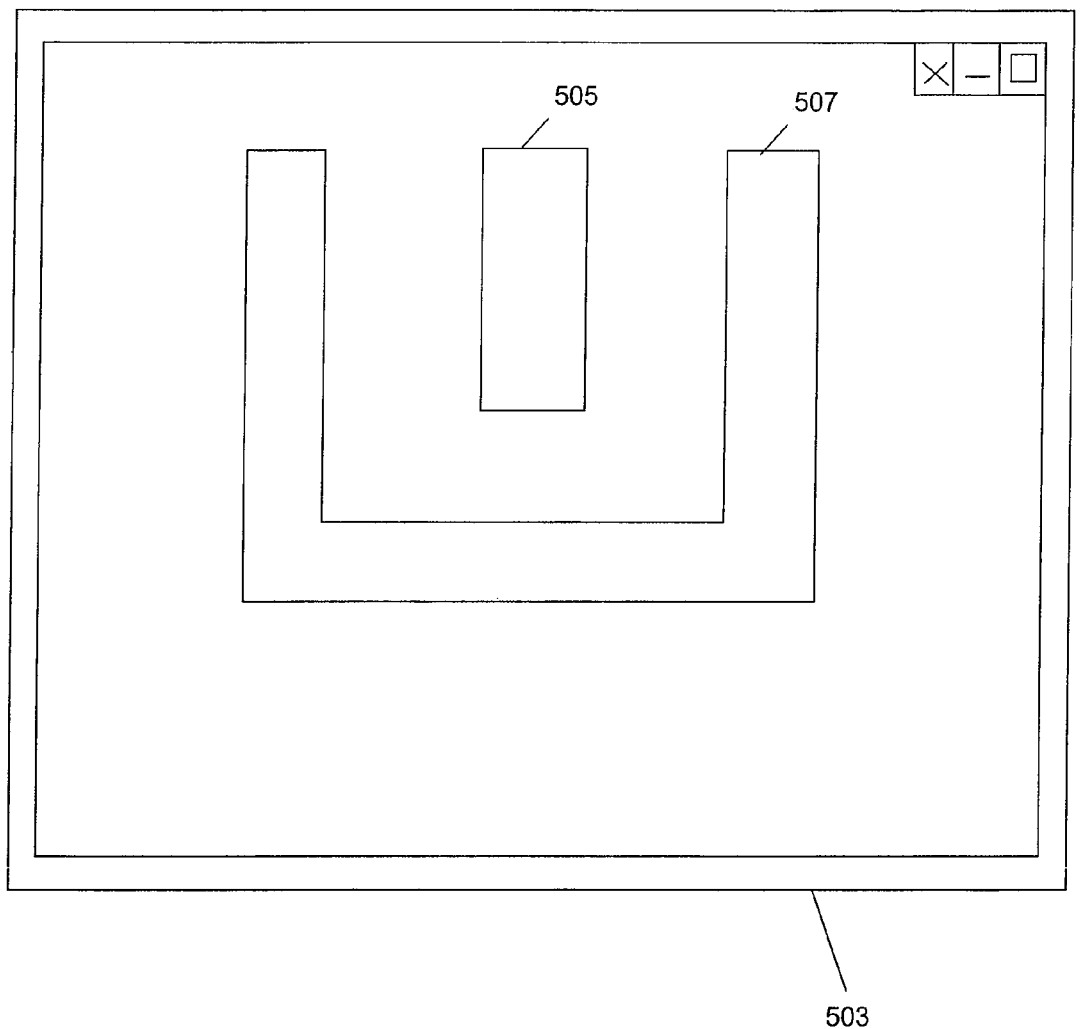
FIGS. 5A-B illustrate an embodiment of the invention applied to visually display and to enter a layout change involving multiple edges.
Figure 5B:
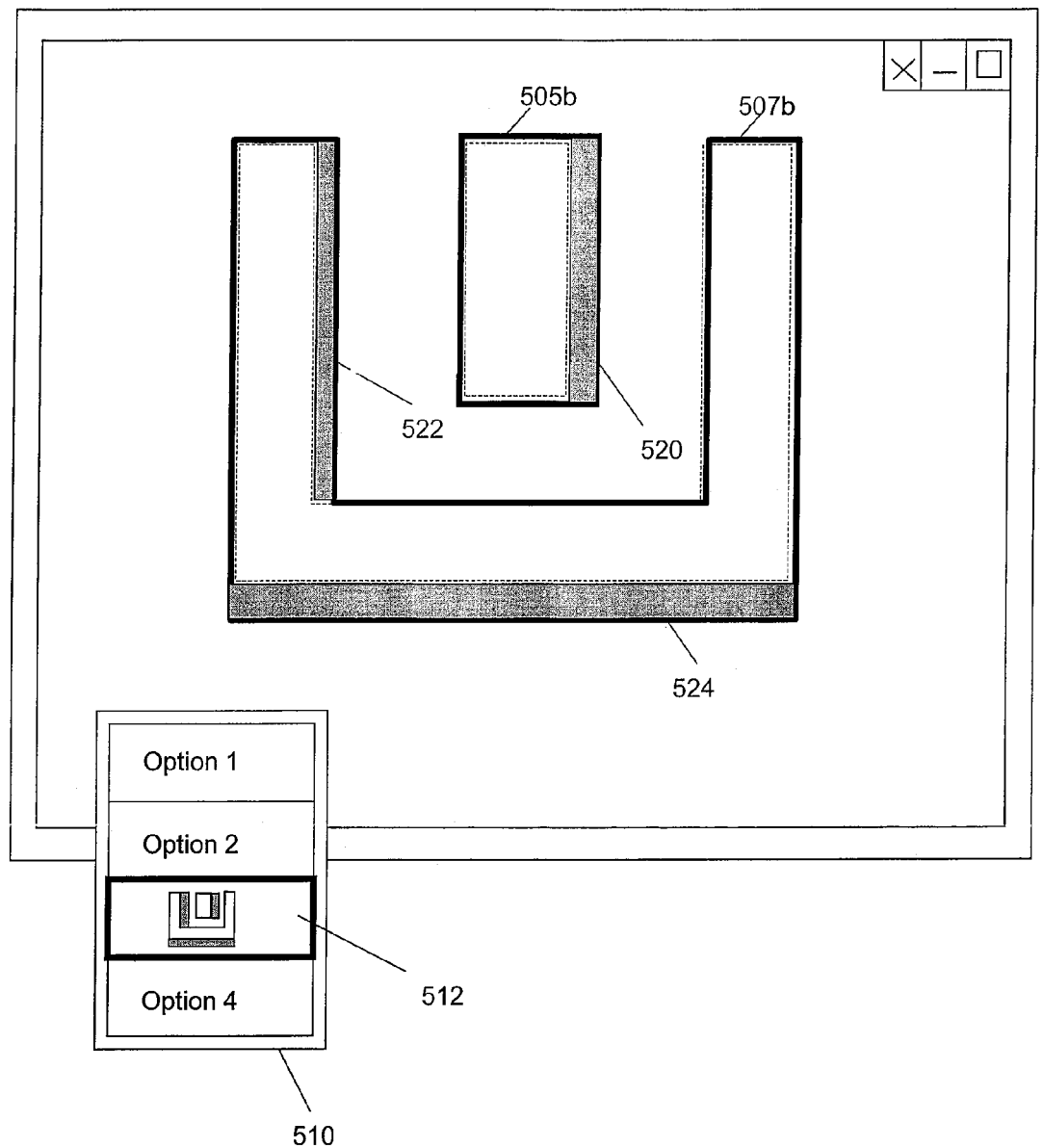

To illustrate this advantage, consider the layout configuration shown in the window 503 of FIG. 5A. This layout configuration includes a first object 505 and a second object 507. Assume that this configuration corresponds to a design error that needs to be corrected. FIG. 5B shows a menu structure 510 that includes a list of possible layout options to correct the design error. Here, further assume that it is desired to visualize and select option 512 from menu structure 510. This option modifies object 505 into object 505b and object 507 to 507b. In particular, object 505b differs from object 505 in that the right edge 520 of object 505b extends and is wider to the right than object 505. Object 507b differs from object 507 with respect to the different configuration for edges 522 and 524. In this example, a single option selection for option 512 from menu structure 510 results in layout configuration changes involving multiple edges 520, 522, and 524.

The invention can be used to implement configuration changes for any layout purpose or requirements, and is not restricted merely to address placement and routing of circuit structures and interconnects. For example, the invention can be applied to enter or change layout configurations to address layout density requirements.

Figure 6A:
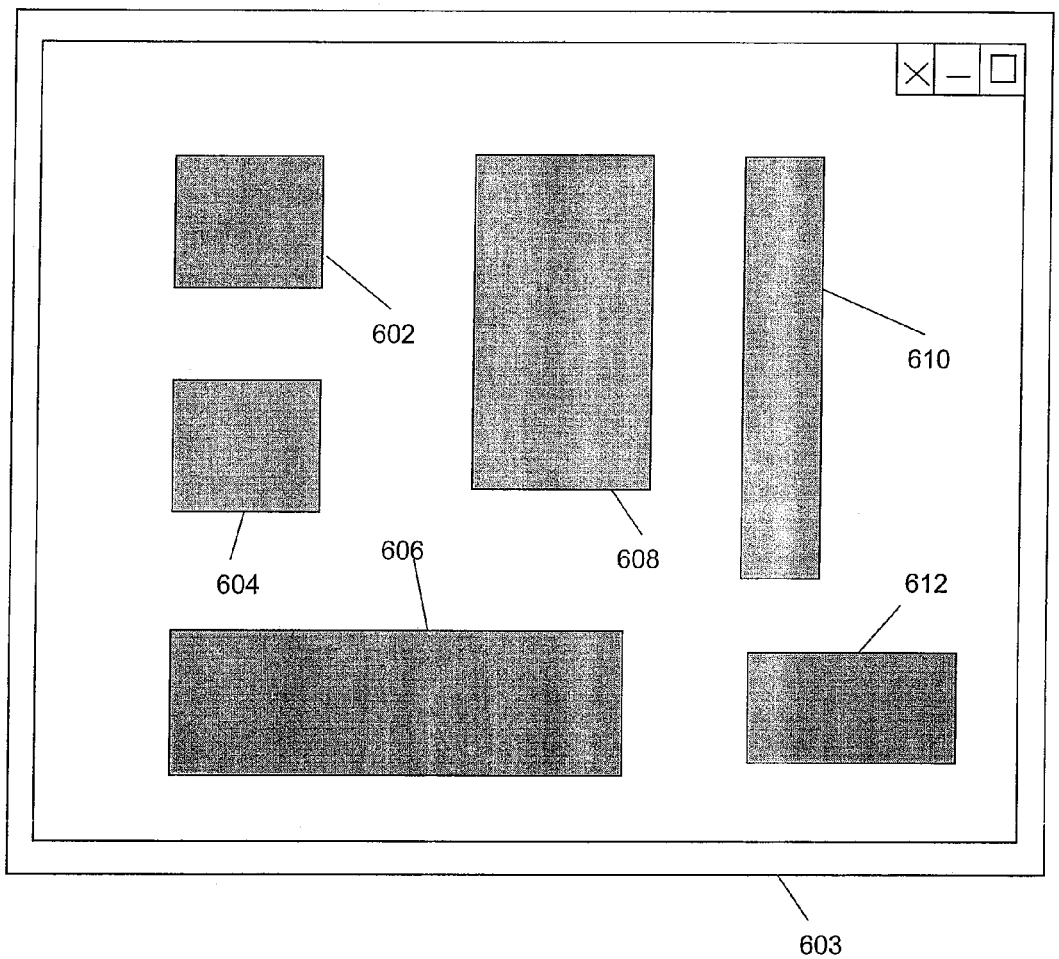
FIGS. 6A-B illustrate an embodiment of the invention applied to visually display and to enter a layout change involving changes to density of a layout portion.
Figure 6B:
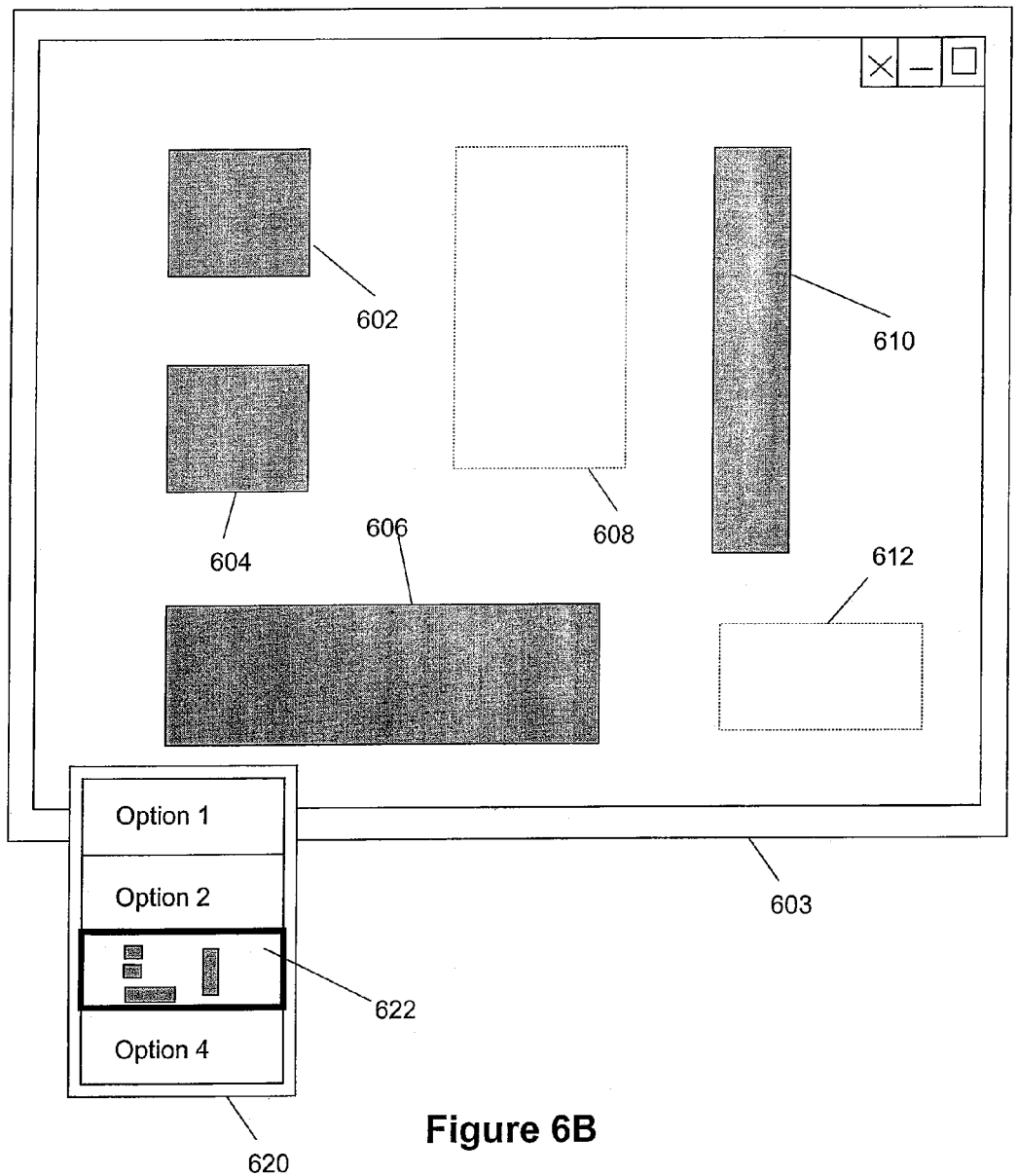

To illustrate this application of the invention, reference is made to the layout configuration shown in window 603 of FIG. 6A. This displayed portion of the layout includes objects 602, 604, 608, 610, and 612. Assume that the verification process identifies density problem with this portion of the layout, in that the layout portion includes too much metal than is acceptable based upon design rules provided by the manufacturing facility. Embodiments of the invention can be employed to visually display different layout options to correct this density problem. As shown in FIG. 6B, a menu structure 620 can be used to provide a list of possible solutions to the density problem. In this example, option 622 can be visualized and selected from menu structure 620, to provide an option to correct the density problem whereby objects 608 and 612 are removed from the layout portion. This option is visually displayed to the user within window 603 when the mouse pointer is hovered over menu item 622 in menu structure 620.

Therefore, what has been described is an improved method, system, and computer program product for visually presenting layout options for generating an electronic design. The visual presentation could be employed to display a set of layout choices when correcting errors or rules violations identified in the design. Alternatively, the visual presentation could be employed to display layout choices during the initial design entry phase for the electronic design. It is noted that the present inventions can be applied to other types of design activities as well, and is not necessarily restricted to layout activities for a circuit design.

System Architecture Overview

Figure 7:
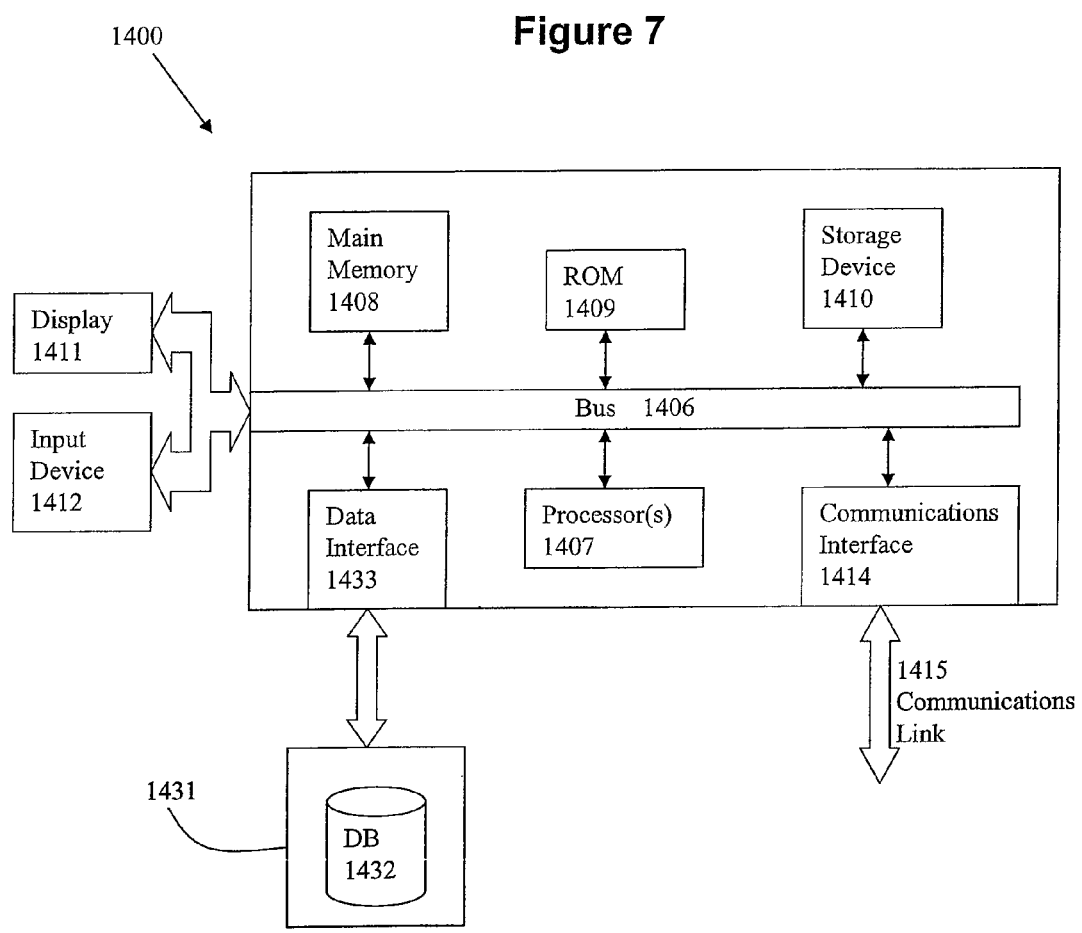
FIG. 7 illustrates an example computing architecture with which the invention may be implemented.

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method for implementing a circuit design, comprising:

identifying an electronic design for which design operations need to be performed, the design operations to implement a configuration of one or more circuit elements within the electronic design;

identifying a portion of the electronic design for which the design operations need to be performed;

determining a plurality of possible alternative circuit element configurations for the portion of the electronic design for which the design operations need to be performed; and presenting, by using a processor, an interface that lists the plurality of possible alternative circuit element configurations for the portion of the electronic design for which the design operations need to be performed, the interface allowing a visualization choice for the plurality of possible alternative circuit element configurations when correcting errors or rules violations identified in the electronic design, in which the visualization choice is one of the plurality of possible alternative circuit element configurations, wherein the visualization choice causes a view of the portion of the electronic design to visually display on a display a representation of the one of the plurality of possible alternative circuit element configurations that corresponds to the visualization choice.

2. The method of claim 1 in which the design operations are layout operations and the plurality of possible circuit element configurations comprises a plurality of layout configurations.

3. The method of claim 1 in which the design operations comprise verification and the electronic design is an existing design.

4. The method of claim 1 in which the design operations comprise design entry, and the electronic design is a new electronic design.

5. The method of claim 1 in which the interface comprises a menu structure.

6. The method of claim 5 in which the menu structure displays, for each listed configuration, a text label, textual description, or pictorial representation.

7. The method of claim 6 in which the pictorial representation shows a proportionally correct picture of the configuration.

8. The method of claim 1 further comprising:
allowing selection of the visualization choice for entry of the corresponding element configuration into the electronic design.

9. The method of claim 8 in which selection is performed by selecting a menu item from within a menu structure using a pointer mechanism.

10. The method of claim 1 in which the plurality of possible circuit element configurations is sorted when listed in the interface.

11. The method of claim 10 in which a score or ranking is determined for the plurality of possible circuit element configurations.

12. The method of claim 10 in which cost, user preference, or historical activity is employed to perform sorting.

13. The method of claim 12 in which cost is calculated based at least in part upon layout area, number of edges, rule violation costs, or manufacturability.

14. The method of claim 1 in which the design operations relate to placement operations, routing operations, or density operations.

15. A system for implementing a circuit design, comprising:
a display having display elements that are capable of displaying an image of an electronic design;
a pointing device that controls the movement of a pointing structure on the display, the pointing structure movable across the image of the electronic design on the display;
a memory that holds the electronic design for which design operations need to be performed, the design operations to implement a configuration of one or more circuit elements within the electronic design;
a processor executing program code to implement at least a portion of the electronic design, the program code capable of accessing the electronic design to determine a plurality of possible alternative circuit element configurations for the portion of the electronic design for which the design operations need to be performed and presenting an interface on the display that lists the plurality of possible alternative circuit element configurations for the portion of the electronic design for which the design operations need to be performed, the interface controllable by the pointing device to allow selection of a visualization choice from among the plurality of possible alternative circuit element configurations, in which the visualization choice is one of the plurality of possible circuit element configurations, wherein the visualization choice causes a view of the portion of the electronic design to visually display on the display a representation of the one of the plurality of possible alternative circuit element configurations that corresponds to the visualization choice when correcting errors or rules violations identified in the electronic design.

16. The system of claim 15 in which the design operations are layout operations and the plurality of possible circuit element configurations comprises a plurality of layout configurations.

17. The system of claim 15 in which the design operations comprise verification and the electronic design is an existing design or in which the design operations comprise design entry, and the electronic design is a new electronic design.

18. The system of claim 15 in which the interface comprises a menu structure.

19. The system of claim 18 in which the menu structure displays, for each listed configuration, a text label, textual description, or pictorial representation.

20. The system of claim 15 in which the pointing device is configured to make a selection of the visualization choice for entry of the corresponding element configuration into the electronic design.

21. The system of claim 15 in which the plurality of possible circuit element configurations is sorted when listed in the interface.

22. The system of claim 21 in which cost, user preference, or historical activity is considered for sorting.

23. The system of claim 22 in which cost is calculated based at least in part upon layout area, number of edges, rule violation costs, or manufacturability.

24. The system of claim 15 in which the design operations relate to placement operations, routing operations, or density operations.

25. A computer program product that includes a non-transitory computer readable storage medium, the computer readable medium comprising a plurality of computer instructions which, when executed by a processor, cause the processor to execute performing a process for implementing a circuit design, the process comprising:
identifying an electronic design for which design operations need to be performed, the design operations to implement a configuration of one or more circuit elements within the electronic design;

identifying a portion of the electronic design for which the design operations need to be performed;

determining a plurality of possible alternative circuit element configurations for the portion of the electronic design for which the design operations need to be performed; and presenting an interface that lists the plurality of possible alternative circuit element configurations for the portion of the electronic design for which the design operations need to be performed, the interface allowing a visualization choice for the plurality of possible alternative circuit element configurations, in which the visualization choice is one of the plurality of possible alternative circuit element configurations, wherein the visualization choice causes a view of the portion of the electronic design to visually display on a display a representation of the one of the plurality of possible alternative circuit element configurations that corresponds to the visualization choice when correcting errors or rules violations identified in the electronic design.

26. The product of claim 25 in which the design operations are layout operations and the plurality of possible alternative circuit element configurations comprises a plurality of layout configurations.

27. The product of claim 25 in which the plurality of possible alternative circuit element configurations is sorted when listed in the interface, in which cost, user preference, or historical activity is considered for sorting, wherein the cost is calculated based at least in part upon layout area, number of edges, rule violation costs, or manufacturability.

* * * * *